(12) United States Patent
Farjad-rad

(10) Patent No.: US 7,274,242 B2
(45) Date of Patent: Sep. 25, 2007

(54) PASS TRANSISTORS WITH MINIMIZED CAPACITIVE LOADING

(75) Inventor: Ramin Farjad-rad, Mountain View, CA (US)

(73) Assignee: Rambus Inc., Los Altos, CA (US)

(*) Notice: Subject to any disclaimer, the term of this patent is extended or adjusted under 35 U.S.C. 154(b) by 0 days.

(21) Appl. No.: 10/980,021

(22) Filed: Nov. 2, 2004

(65) Prior Publication Data

US 2006/0091932 A1 May 4, 2006

(51) Int. Cl.
*H03K 17/16* (2006.01)
(52) U.S. Cl. .................................. 327/382; 327/91
(58) Field of Classification Search .............. 327/91, 327/92, 93, 94, 95, 96, 112, 379, 380, 381, 327/382
See application file for complete search history.

(56) References Cited

U.S. PATENT DOCUMENTS

| | | | | |
|---|---|---|---|---|
| 3,872,325 | A * | 3/1975 | Adams et al. | 327/389 |
| 5,844,431 | A | 12/1998 | Chen | |
| 6,097,231 | A * | 8/2000 | Moscaluk | 327/264 |
| 6,225,795 | B1 | 5/2001 | Stratakos et al. | |
| 6,265,911 | B1 | 7/2001 | Nairn | |
| 6,329,874 | B1 | 12/2001 | Ye et al. | |
| 6,380,644 | B1 | 4/2002 | Iliasevitch | |
| 6,396,325 | B2 * | 5/2002 | Goodell | 327/308 |
| 6,429,692 | B1 | 8/2002 | Chan et al. | |

(Continued)

FOREIGN PATENT DOCUMENTS

DE   44 28 548 A1   2/1996

(Continued)

OTHER PUBLICATIONS

Inukai, T. et al., "Boosted Gate MOS (BGMOS): Device/Circuit Cooperation Scheme to Achieve Leakage-Free Giga-Scale Integration." CICC May 2004 Technical Program. 4 pages.

(Continued)

*Primary Examiner*—Jeffrey Zweizig
(74) *Attorney, Agent, or Firm*—Silicon Edge Law Group LLP; Arthur J. Behiel

(57) ABSTRACT

A tracking switch includes an MOS switching transistor with a control terminal coupled to a CMOS inverter. The relative geometries of the transistors that make up the inverter are significantly imbalanced, resulting is substantially different drive strengths (i.e., substantially different on-resistances). The gate of the switching transistor exhibits parasitic capacitances between its current-handling terminals and its control terminal. When the switching transistor is on, these capacitances shunt a portion of the switched signal to a power-supply node, with the problem increasing with the frequency of the propagated signal. The geometry of the transistor used to turn on the switching transistor is selected to produce a high on-resistance, which introduces a high-impedance path from the control terminal of the switching transistor to ground when the switch is closed. The high-impedance path isolates the control terminal of the switching transistor from the supply, thus mitigating the capacitive loading effects of the parasitic capacitors. The transistor used to turn off the switching transistor has a much lower on-resistance than the transistor used to bias the switching transistor on, preventing undesirable signal feed-through from occurring when the switching transistor is off.

19 Claims, 2 Drawing Sheets

U.S. PATENT DOCUMENTS

2001/0007430 A1* 7/2001 Goodell ............... 327/308
2004/0008059 A1  1/2004 Chen et al.
2004/0196089 A1  10/2004 O'Donnell et al.

FOREIGN PATENT DOCUMENTS

EP        1 115 202 A1    7/2001

OTHER PUBLICATIONS

Rao, Rahul M. et al. "Circuit Techniques for Gate and Sub-Threshold Leakage Minimization in Future CMOS Techologies." European Solid-State Circuits Conference. Sep. 2003. 4 pages.

Sidiropoulos, Stefanos, et al., "A 700-Mb/s/pin CMOS Signaling Interface Using Current Integrating Receivers." IEEE Journal of Solid-State Circuits, vol. 32, No. 5, May 1997. pp. 681-690.

* cited by examiner

PASS TRANSISTORS WITH MINIMIZED CAPACITIVE LOADING

FIELD OF THE INVENTION

The present invention relates generally to the field of communications, and more particularly to high speed electronic signaling within and between integrated circuit devices.

BACKGROUND

MOS devices are commonly used as tracking switches. Such applications include samplers, multiplexers, track/hold circuits, etc. In the high-speed domain, the non-zero resistance and capacitance of an MOS transistor used to implement such a switch introduce bandwidth limitations that degrade the signal quality. There are techniques for reducing the channel resistance of MOS transistors, and consequently extending the operable bandwidth of tracking switches that utilize them. These techniques include driving the transistor gate by a voltage greater than the supply voltage. Using such so-called "overdrive" gate voltages provides higher channel conductance, and thus lower on-resistance; however, the circuitry required to generate the overdrive voltage above or below the supply voltages (e.g. greater than Vdd or less than ground potential) may be complex and require overdrive protection. There is therefore a need in the art for methods and circuits capable of switching high-speed signals without undue signal attenuation, particularly at relatively high frequencies.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2A depicts a tracking switch 200 in accordance with another embodiment. Switch 200 is similar in some way to switch 100 of FIG. 1A, like-numbered elements being the same or similar.

DETAILED DESCRIPTION

Figure 1A:
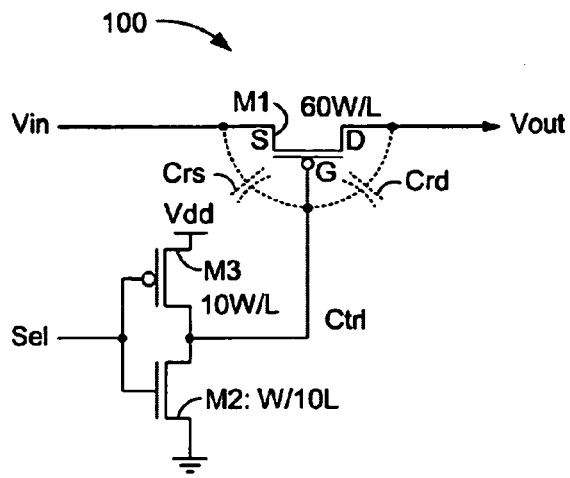
FIG. 1A depicts a switch 100, in accordance with one embodiment, that selectively passes a high-speed signal between an input terminal Vin and an output terminal Vout.
Figure 1B:
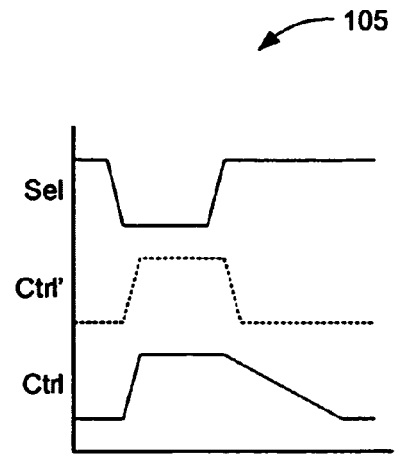
FIG. 1B is a waveform diagram 105 illustrating the operation of switch 100 of FIG. 1A.

FIG. 1A depicts a switch 100, in accordance with one embodiment, that selectively passes a high-speed signal between an input terminal Vin and an output terminal Vout. FIG. 1B is a waveform diagram 105 illustrating the operation of switch 100 of FIG. 1A. Switch 100 includes a PMOS switching transistor M1 with a first current-handling terminal (e.g., a source S) coupled to input terminal Vin, a second current-handling terminal (e.g., a drain D) coupled to output terminal Vout, and a control terminal (e.g., a gate G) coupled to a control line Ctrl. Control line Ctrl is coupled to switch select terminal Sel via a CMOS inverter comprised of an NMOS transistor M2 and a PMOS transistor M3.

When select signal Sel is de-asserted (i.e., at a relatively low voltage expressive of a logic zero), transistor M3 pulls control line Ctrl high, in this case toward supply voltage Vdd, turning off transistor M1; conversely, when select signal Sel is asserted (i.e., at a relatively high voltage expressive of a logic one), transistor M2 pulls control line Ctrl low, in this case toward ground, turning on transistor M1. Though not shown, select signal Sel and transistors M2 and M3 can likewise control additional pass transistors.

At the schematic level, switch 100 is no different from some conventional switches. The improvement lies in the relative geometries of the transistors. In a conventional switch, transistors M2 and M3 are of similar strength, providing approximately the same on-resistance. Conventional inverters thus produce an inverted version of select signal Sel that follows changes in select signal Sel. Such a hypothetical inverted select signal is depicted in FIG. 1B as control signal Ctrl', which is shown as a dashed line mirroring select signal Sel. In switch 100, however, transistor M2 has a relatively high on-resistance, realized by a relatively narrow, long-channeled NMOS device in this example. Transistor M3 is relatively wider and shorter, and consequently exhibits a much lower on-resistance. The control signal Ctrl applied to transistor M1 thus rises rapidly when transistor M3 is turned on (and transistor M2 off) and falls relatively slowly when transistor M2 is turned on (and transistor M3 off). The impedance between the current-handling terminals of a transistor biased on is primarily resistive, and is therefore referred to herein as an "on-resistance," whereas the impedances between the current-handling terminals and the gate is primarily capacitance, and is therefore referred to as an impedance.

With reference to FIG. 1B, an illustrative signal Ctrl shows that the rise and fall times are substantially different due to the disparate on-resistances of transistors M3 and M2. Switch 100 thus turns off much more quickly than on. The relatively slow turn-on speed is not important for some applications, such as when switch 100 is to be part of a programmable interconnect structure, and results in considerable performance gains when switch 100 is employed to transmit high-frequency signals.

The gate of transistor M1 exhibits parasitic capacitances Crs and Crd between respective current-handling terminals and the control terminal. These capacitances result from misalignment and overlap of the gate of transistor M1 with respect to source and drain diffusions. Transistor M1 additionally exhibits a channel capacitance Cch, the value of which is primarily a function of the gate area and properties of the gate insulator. For a more detailed discussion of the parasitic and inherent elements of a typical MOS transistor, see pp. 435–445 of "Device Electronics for Integrated Circuits, Second Edition," by R. S. Muller and T. I. Kamins (1986), which is incorporated herein by reference. Notably, that reference separates channel capacitance Cch into gate-to-source capacitance Cgs and gate-to-drain capacitance Cgd.

When switch 100 is on, transistor M2 connects both current-handling terminals of transistor M1 to ground via the parasitic and channel capacitances. As is well known, the impedance Z through a capacitance reduces with frequency, and is described using the following equation: $Z=(C2\pi f)^{-1}$, where C is capacitance and f is signal frequency. The impedance Z from the current-handling terminals of transistor M1 to line Ctrl, and thus to ground, consequently reduces with frequency. Transistor 100, when turned on, therefore acts as a low-pass filter, shunting high-frequency signal components to ground via transistor M2.

The geometry of transistor M2 is selected to produce a high on-resistance, which introduces a high-impedance path from the control terminal of transistor M1 to ground. The high-impedance path isolates the control terminal of transistor M1 from ground, thus mitigating the capacitive loading effects of parasitic capacitors C1 and C2. In other words, as the frequency of the input signal increases, the high series impedance provided by transistor M2 limits the effective conductance from the current-handling terminals of transistor M1 to ground. Transistor M3 has a much lower on-resistance than transistor M2, and is thus capable of turning off transistor M1 quickly and preventing signal feed-through when switch 100 is biased off.

The length "L" of transistors is most commonly the minimum feature size afforded by the process used to form the transistors. This convention holds true for transistors M1 and M3, but transistor M2 has a length ten times the minimum feature size. The respective geometries of the transistors of FIG. 1 are as follows:

a. transistor M1 has a W/L ratio of 60, which is to say that the gate width of transistor M1 is 60 times the length;

b. transistor M2 has a W/L ratio of 1/10, which is to say that the gate length of transistor M2 is 10 times the width; and c. transistor M3 has a W/L ratio of 10, which is to say that the gate width of transistor M3 is 10 times the length.

The W/L ratio of transistor M3 is thus 100 times the W/L ratio of transistor M2, in this example. The relationship between the geometries of transistors M2 and M3 can vary, however. The W/L ratio of transistor M3 might be at least ten times the W/L ratio of transistor M2, for example.

Changing transistor length-to-width ratios is only one way to alter transistor behavior. For example, capacitive values for an MOS transistor can change with the type and thickness of the gate dielectric, and resistive values can vary considerable for different types of devices, doping levels, feature geometries, supply voltage levels, etc. As a consequence of such variations, some embodiments characterize the relationship between transistors M1, M2, and M3 in terms of impedance.

The minimum impedance $Z_{min}$ from the current-handling terminals of transistor M1 to control line Ctrl may be expressed as $Z_{min}=(C2\pi f_{max})^{-1}$, where C is the total gate capacitance (Crs+Crd+Cch) of transistor M1 and $f_{max}$ is the maximum frequency of input signal Vin. In one embodiment, the on-resistance of transistor M2 may be greater than impedance $Z_{min}$, over an order of magnitude greater in some examples. Stated in another way, at frequency $f_{max}$ the absolute value of the voltage $V_{GS}$ developed between terminal Vin and line Ctrl is less than or equal to the absolute value of voltage Vin divided by the square root of two. Stated mathematically, when signal Vin is at frequency $f_{max}$:

$$|V_{GS}| \le \frac{|V_{in}|}{\sqrt{2}} \quad (1)$$

The relationship of equation (1) ignores some minor variables for simplicity, but is a reasonably accurate approximation. To ensure transistor M1 turns off quickly and to minimize signal feedthrough when transistor M1 is off, the on-resistance of transistor M3 is typically at least an order of magnitude lower than impedance $Z_{min}$.

Figure 2A:
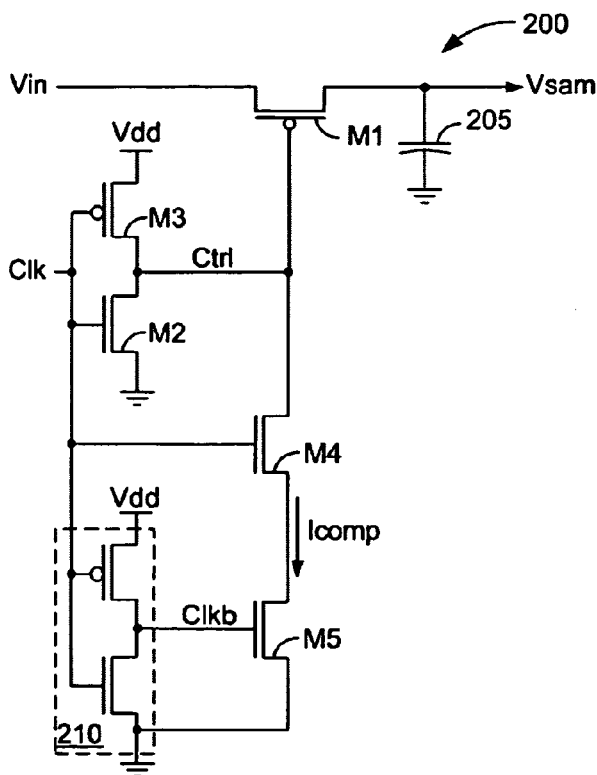
Figure 2B:
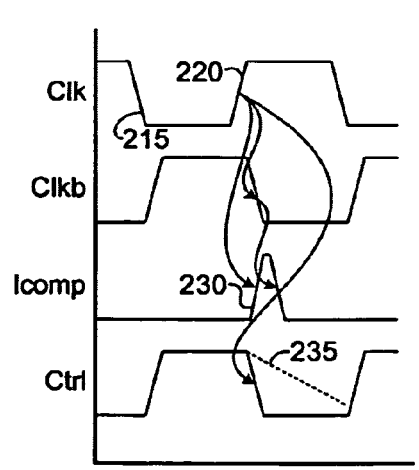
FIG. 2B is a waveform diagram illustrating the operation of switch 200 of FIG. 2A.

FIG. 2 depicts a tracking switch 200 in accordance with another embodiment. Switch 200 may be similar in some ways to switch 100 of FIG. 1A, like-numbered elements being the same or similar. FIG. 2B is a waveform diagram 212 illustrating the operation of switch 200 of FIG. 2A.

Switch 200 is a tracking switch adapted for use in e.g. high-speed voltage samplers, however, and so is modified in accordance with another embodiment to turn on more quickly than switch 100 of FIG. 1. Switch 200 switches on and off in response to a clock signal Clk on a like-named input terminal to sample an input signal on input terminal Vin. Sampled voltages are stored across a load capacitor 205 as a sampled voltage Vsam. Two additional NMOS transistors M4 and M5 and a CMOS inverter 210 assist transistor M2 in pulling the control terminal of transistor M1 down to turn transistor M1 on quickly in response to rising edges of clock signal Clk.

Switch 200 responds to falling edges on line Clk in much the same way switch 100 of FIG. 1 responds to falling edges on line Ctrl. Turning to FIG. 2B, inverter 210 responds with a corresponding rising edge and transistor M3 pulls control line Ctrl high (toward Vdd). The rising edge on line Clkb turns on transistor M5, but this has little or no effect because the falling edge of clock signal Clk turns transistor M4 off, isolating the control terminal of transistor M1 from ground.

Switch 200 responds to rising edges on line Clk in much the same way switch 100 of FIG. 1 responds to rising edges on line Sel, but transistors M4 and M5 create an open a path to ground for an instant, passing a current spike Icomp to help transistor M2 quickly turn off transistor M1. The resulting signals are exaggerated in FIG. 2A for ease of illustration.

Transistor M5 is on when clock signal Clk is high, and thus offers a path to ground upon the arrival of he first rising clock edge 220 of clock signal Clk. Rising edge 220 turns on transistors M2, M4, and the NMOS transistor of inverter 210. Due to the delay inherent in inverter 210, transistor M4 begins turning on before transistor M5 begins turning off. Transistors M4 and M5 thus shunt charge away from the control terminal of transistor M1, as illustrated by a current spike 230 in FIG. 2B. The duration of current spike 230 can be adjusted by altering the delay induced by inverters 210. In some embodiments, inverter 210 is programmable, as by the selective inclusion of parallel transistors or by controlling the level of supply current.

Transistor M2, with the help of current spike 230, pulls line Ctrl low to turn transistor M1 on. Transistor M2 then holds the on state beyond the duration of spike 230, at which time transistor M5 is off. As in the example of FIG. 1A, transistor M2 is highly resistive in the on state, which reduces the impact of the gate capacitance of transistor M1 on higher-frequency signals. Switch 200 thus turns on quickly without a low-resistance path between the control terminal of transistor M1 and ground. (A dashed line 235 indicates the slow fall-time of signal Ctrl that would occur in the absence of the help from current spike 230.) The strength of transistors M4 and M5 may be selected to match that of transistor M3. In one embodiment, for example, transistors M4 and M5 each have the same W/L ratio of transistor M3. PMOS transistors are generally about twice as resistive as NMOS transistors, so the on-resistance of each of NMOS transistors M4 and M5 is about half that of transistor M3. Resistance adds in series however, so the on-resistance of transistors M4 and M5 combined approximately matches the on-resistance of transistor M3.

Figure 3:
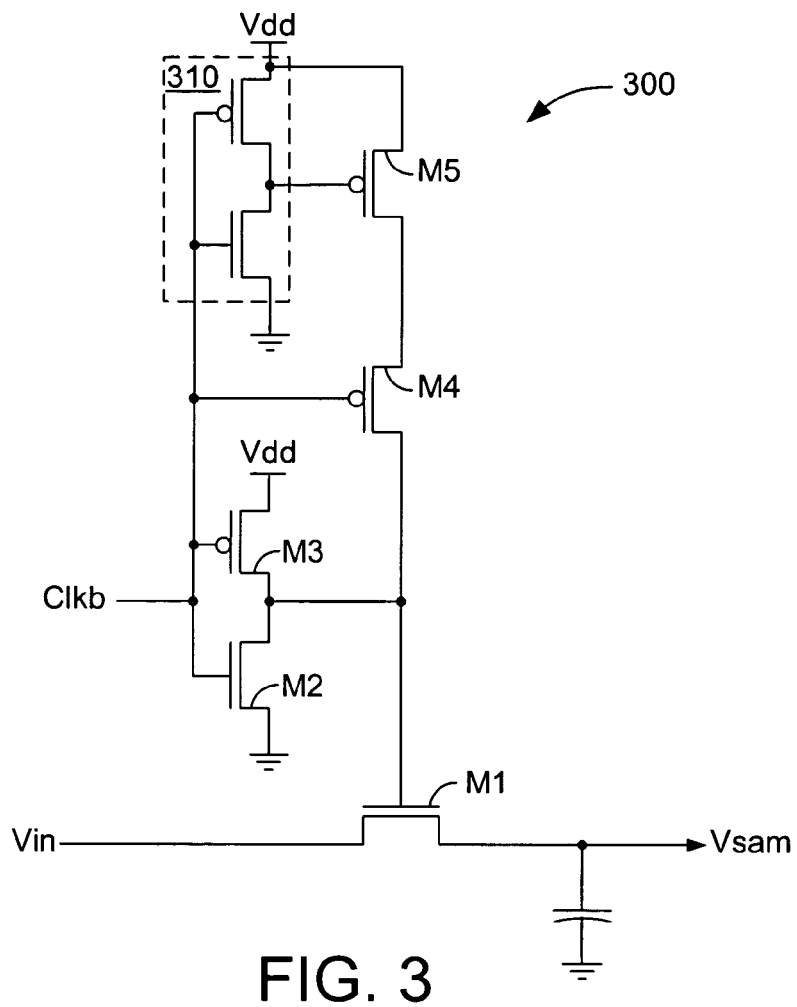
FIG. 3 depicts a tracking switch 300 in accordance with another embodiment. Switch 300 is similar to switch 200 in FIG. 2A, but includes an NMOS transistor M1 disposed between an input terminal Vin and an output terminal Vsam.

FIG. 3 depicts a tracking switch 300 in accordance with another embodiment. Switch 300 is similar to switch 200 in FIG. 2A, but includes an NMOS transistor M1 in place of the PMOS transistor M1 in FIG. 2A. In this example, transistor M2 exhibits a much lower on-resistance than transistor M3, and transistors M4 and M5 and an inverter 310 assist transistors M3 in turning on transistor M1 quickly. As is well understood in the art, PMOS transistors employ channels of p-type material that is generally less conductive than the n-type material employed in NMOS transistors. The desired relationship between the on-resistances of transistors M2 and M3 may therefore be obtained using somewhat different respective W/L ratios as compared with the examples of FIGS. 1A and 2A.

Figure 4:
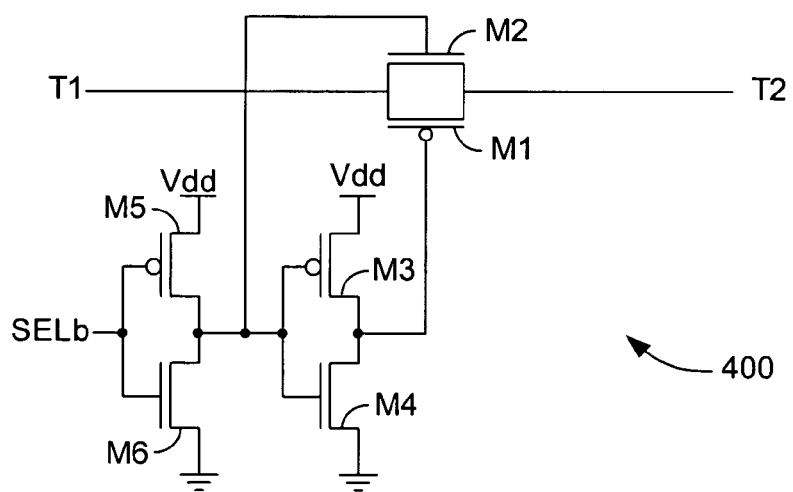
FIG. 4 depicts a transmission gate 400 in accordance with yet another embodiment. Pass gate 400 includes NMOS and PMOS transistors 405 and 410, respectively, coupled in parallel between terminals T1 and T2.

FIG. 4 depicts a transmission gate 400 in accordance with yet another embodiment. Pass gate 400 includes NMOS and PMOS transistors 405 and 410, respectively, coupled in parallel between terminals T1 and T2. Transmission gate 400 can pass signals between terminals T1 and T2 in either direction without a threshold drop. An active-low select signal SELb selectively closes gate 400 via a series-coupled pair of CMOS inverters.

As in the foregoing examples, the control gates of transistors M1 and M2 are coupled to ground and Vdd, respectively, via transistors exhibiting relatively high on-resistances, and are coupled to Vdd and ground, respectively, via transistors exhibiting relatively high on-resistances. The W/L ratios of the four transistors M3, M4, M5, and M6 that control transistors M1 and M2 in one embodiment are as follows: M3=10W/L, M4=W/10L, M5=W/4L and M6=5W/L. Where switching speed is an issue, configurations of the type described above in connection with FIGS. 2A and 3 to reduce the turn-on time of pass transistors can be included to momentarily assist transistors M4 and M5.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. A signal line is said to be "activated" when a signal is asserted on the signal line, and "deactivated" when the signal is de-asserted. Additionally, the prefix symbol "/" attached to signal names indicates that the signal is an active low signal (i.e., the asserted state is a logic low state). Whether a given signal is an active low or an active high will be evident to those of skill in the art.

An output of the design process for an integrated circuit, or a portion of an integrated circuit, may be a computer-readable medium (e.g., a magnetic tape or an optical or magnetic disk) encoded with data structures or other information defining circuitry that may be physically instantiated as an integrated circuit or portion of an integrated circuit. These data structures are commonly written in Caltech Intermediate Format (CIF) or GDSII, a proprietary binary format. Those of skill in the art of mask preparation can develop such data structures from schematic diagrams of the type detailed above.

While the present invention has been described in connection with specific embodiments, variations of these embodiments will be obvious to those of ordinary skill in the art. For example:

1. While the foregoing embodiments employ MOS transistors formed using standard CMOS processes, other transistor types or combinations of transistor types might also be used.
2. As noted in the background section above, some conventional devices overdrive the switched transistor to reduce the on-resistance, and consequently increase speed performance. Embodiments of the invention can be adapted to overdrive the gate to achieve still better high frequency performance.
3. Pass gates in accordance with other embodiments can be adapted to including clocking, e.g. in the manner described above in connection with FIGS. 2A and 3.

Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. Section 112.

What is claimed is:
1. A circuit comprising:
   a. a first transistor having first and second current-handling terminals, a first control terminal, and a first width-to-length (W/L) ratio;
   b. a second transistor having a third current-handling terminal coupled to the first control terminal, a fourth current-handling terminal, a second control terminal, and a second W/L ratio; and
   c. a third transistor having a fifth current-handling terminal coupled to the first control terminal, a sixth current-handling terminal, a third control terminal, and a third W/L ratio at least ten times the second W/L ratio;
   d. wherein the second W/L ratio is less than 0.2 times the first W/L ratio.

2. The circuit of claim 1, further comprising a capacitor coupled to the second current-handling terminal.

3. The circuit of claim 1, wherein the fourth current-handling terminal is connected to a power-supply terminal.

4. The circuit of claim 3, wherein the sixth current-handling terminal is connected to a second power-supply terminal.

5. The circuit of claim 1, wherein the first and third transistors are PMOS transistors.

6. A circuit comprising:
   a. a first transistor having first and second current-handling terminals, a first control terminal, and a first width-to-length (W/L) ratio;
   b. a second transistor having a third current-handling terminal coupled to the first control terminal, a fourth current-handling terminal, a second control terminal, and a second W/L ratio;
   c. a third transistor having a fifth current-handling terminal coupled to the first control terminal, a sixth current-handling terminal, a third control terminal, and a third W/L ratio at least ten times the second W/L ratio;
   d. a fourth transistor having a seventh current-handling terminal coupled to the first control terminal, an eighth current-handling terminal, and a fourth control terminal coupled to the second control terminal;
   e. a fifth transistor having a ninth current-handling terminal coupled to the eighth current-handling terminal, a tenth current-handling terminal, and a fifth control terminal; and
   f. a delay element coupled between the second control terminal and the fifth control terminal.

7. The circuit of claim 6, wherein the delay element includes an inverter.

8. A circuit comprising:
   a. a first transistor having first and second current-handling terminals, a first control terminal, and a first width-to-length (W/L) ratio;
   b. a second transistor having a third current-handling terminal coupled to the first control terminal, a fourth current-handling terminal, a second control terminal, and a second W/L ratio;
   c. a third transistor having a fifth current-handling terminal coupled to the first control terminal, a sixth current-handling terminal, a third control terminal, and a third W/L ratio at least ten times the second W/L ratio; and
   d. a clock node coupled to the second and third control terminals and receiving a clock signal.

9. A circuit comprising:
   a. an input node receiving an input signal of a maximum input frequency;
   b. a first transistor having a first current handling terminal coupled to the input node, a second current-handling terminal, and a first control terminal, wherein the first transistor, when biased on, exhibits an impedance to the input signal at the maximum input frequency between the first current-handling terminal and the first control terminal;
   b. a second transistor having a third current-handling terminal coupled to the first control terminal, a fourth current-handling terminal, and a second control terminal, wherein the second transistor exhibits a first on-resistance between the third and fourth current-handling terminals, and wherein the first on-resistance is greater than the impedance; and
   c. a third transistor having a fifth current-handling terminal coupled to the first control terminal, a sixth current-handling terminal, and a third control terminal, wherein the third transistor exhibits a second on-resistance between the fifth and sixth current-handling terminals, and wherein the second on-resistance is less than ten percent of the first on-resistance;
   d. wherein the first on-resistance is more than five times the third on-resistance.

10. The circuit of claim 9, further comprising a capacitor coupled to the second current-handling terminal.

11. The circuit of claim 9, wherein the fourth current-handling terminal is coupled to a power-supply terminal.

12. The circuit of claim 11, wherein the sixth current-handling terminal is coupled to a second power-supply terminal.

13. A circuit comprising:
   a. an input node receiving an input signal of a maximum input frequency;
   b. a first transistor having a first current handling terminal coupled to the input node, a second current-handling terminal, and a first control terminal, wherein the first transistor, when biased on, exhibits an impedance to the input signal at the maximum input frequency between the first current-handling terminal and the first control terminal;
   b. a second transistor having a third current-handling terminal coupled to the first control terminal, a fourth current-handling terminal, and a second control terminal, wherein the second transistor exhibits a first on-resistance between the third and fourth current-handling terminals, and wherein the first on-resistance is greater than the impedance;
   c. a third transistor having a fifth current-handling terminal coupled to the first control terminal, a sixth current-handling terminal, and a third control terminal, wherein the third transistor exhibits a second on-resistance between the fifth and sixth current-handling terminals, and wherein the second on-resistance is less than ten percent of the first on-resistance;
   d. a fourth transistor having a seventh current-handling terminal coupled to the first control terminal, an eighth current-handling terminal, and a fourth control terminal coupled to the second control terminal;
   e. a fifth transistor having a ninth current-handling terminal coupled to the eighth current-handling terminal, a tenth current-handling terminal, and a fifth control terminal; and
   f. a delay element coupled between the second control terminal and the fifth control terminal.

14. The circuit of claim 13, wherein the delay element includes an inverter.

15. The circuit of claim 9, wherein the first and third transistors are PMOS transistors.

16. A circuit comprising:
   a. an input node receiving an input signal of a maximum input frequency and a first voltage at the maximum input frequency;
   b. a first transistor having a first current handling terminal coupled to the input node, a second current-handling terminal, and a first control terminal, wherein the first transistor, when biased on, exhibits a first impedance to the input signal at the maximum input frequency between the first current-handling terminal and the first control terminal; and
   b. a second transistor having a third current-handling terminal coupled to the first control terminal, a fourth current-handling terminal, and a second control terminal, wherein the second transistor exhibits a second impedance, when biased on, between the third and fourth current-handling terminals;

c. wherein the first transistor develops a second voltage, between the first current-handling terminal and the control terminal; and d. wherein the absolute value of the second voltage at most equals the absolute value of the first voltage divided by the square root of two;

e. a fourth transistor having a seventh current-handling terminal coupled to the first control terminal, an eighth current-handling terminal, and a fourth control terminal coupled to the second control terminal;

f. a fifth transistor having a ninth current-handling terminal coupled to the eighth current-handling terminal, a tenth current-handling terminal, and a fifth control terminal; and g. a delay element coupled between the second control terminal and the fifth control terminal.

17. The circuit of claim 16, further comprising a third transistor having a fifth current-handling terminal coupled to the first control terminal, a sixth current-handling terminal, and a third control terminal, wherein the third transistor exhibits a third impedance, when biased on, between the fifth and sixth current-handling terminals, and wherein the third impedance is less than ten percent of the second impedance.

18. The circuit of claim 16, wherein the second impedance is an on-resistance.

19. The circuit of claim 16, wherein the delay element includes an inverter.

* * * * *